US012711936B2

(12) United States Patent
Eastty et al.

(10) Patent No.: US 12,711,936 B2
(45) Date of Patent: Aug. 18, 2026

(54) SYSTEMS AND METHODS FOR GENERATING A DITHER

(71) Applicant: Apple Inc., Cupertino, CA (US)

(72) Inventors: Peter C Eastty, San Francisco, CA (US); Aniruddha Satoskar, Round Rock, TX (US); Brendan C Larks, San Diego, CA (US)

( * ) Notice: Subject to any disclaimer, the term of this patent is extended or adjusted under 35 U.S.C. 154(b) by 149 days.

(21) Appl. No.: 18/894,674

(22) Filed: Sep. 24, 2024

(65) Prior Publication Data

US 2026/0088011 A1 Mar. 26, 2026

(51) Int. Cl.

| | |
|---|---|
| ***H03M 3/00*** | (2006.01) |
| ***G06F 7/58*** | (2006.01) |
| ***G10K 11/175*** | (2006.01) |
| ***H04R 3/00*** | (2006.01) |
| *H03K 3/84* | (2006.01) |
| *H03K 19/21* | (2006.01) |
| *H03M 1/06* | (2006.01) |

(52) U.S. Cl.

CPC .......... *G10K 11/1752* (2020.05); *G06F 7/584* (2013.01); *H04R 3/00* (2013.01); *G06F 2207/581* (2013.01); *H03K 3/84* (2013.01); *H03K 19/21* (2013.01); *H03M 1/0641* (2013.01)

(58) Field of Classification Search

CPC ............. H03M 1/0634; H03M 1/0656; H03M 1/0641; H03K 3/84; H03K 19/21; G06F 7/584; G06F 2207/581

USPC ................................................ 341/143, 155

See application file for complete search history.

(56) References Cited

U.S. PATENT DOCUMENTS

| | | | |
|---|---|---|---|
| 10,361,627 B1 * | 7/2019 | Goller ..................... | G06F 7/584 |
| 2008/0055651 A1 | 3/2008 | Wei | |
| 2012/0206657 A1 | 8/2012 | Bratt et al. | |
| 2017/0257108 A1 | 9/2017 | Straeussnigg | |
| 2019/0296763 A1 | 9/2019 | Nakamoto | |
| 2022/0294428 A1 * | 9/2022 | Gomm ..................... | H03K 5/01 |
| 2023/0421167 A1 | 12/2023 | Stilgenbauer | |
| 2025/0219652 A1 * | 7/2025 | I .......................... | H03M 1/0675 |

FOREIGN PATENT DOCUMENTS

| | | | |
|---|---|---|---|
| CN | 106788444 | A | 5/2017 |
| CN | 113849155 | A | 12/2021 |
| JP | 2019114837 | A | 7/2019 |
| KR | 20240085164 | A | 6/2024 |

OTHER PUBLICATIONS

R.A. Wannamaker et al., "A Theory of Non-Subtractive Dither," IEEE Transactions on Signal Processing, vol. 48, No. 2, pp. 499-516, Feb. 2000, doi: 10.1109/78.823976.

* cited by examiner

*Primary Examiner* — Peguy Jean Pierre

(74) *Attorney, Agent, or Firm* — Fletcher Yoder, P.C.

(57) ABSTRACT

Electronic devices, circuitry, and methods are provided to efficiently generate a dither signal. An electronic device may include an output device, such as a speaker, to output a media signal, such as an audio signal, based on dithered media data, such as dithered audio data. The electronic device may include dithering circuitry to generate a dither signal, based on a first pseudorandom signal from a first linear feedback shift register and a second pseudorandom signal from a second linear feedback shift register, to add to the media signal to generate the dithered media signal.

20 Claims, 9 Drawing Sheets

SYSTEMS AND METHODS FOR GENERATING A DITHER

BACKGROUND

The present disclosure relates generally to performing dithering using linear feedback shift register (LFSR) based dithering circuitry.

At times, electronic devices may experience audio distortion (e.g., quantization errors). For example, the audio distortion may include quantization noise and harmonic artifacts. The electronic devices may apply audio dithering to reduce the audio distortion. However, the electronic devices may perform audio dithering by executing multiple instructions on dedicated hardware, which may increase latency and/or reduce computing resources. Therefore, it may be desired to perform audio dithering using a single instruction and/or existing hardware of the electronic device to reduce latency and improve availability of the computing resources.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

This disclosure is generally directed to generating a rectangular dither and/or a triangular dither more efficiently using linear feedback shift register (LFSR) based dithering circuitry. In an embodiment, the dithering circuitry may include a first LFSR based pseudorandom signal generator, a second LFSR based pseudorandom signal generator, first bit reversal circuitry, first bitwise exclusive OR (XOR) circuitry, floating point conversion circuitry, and/or subtraction circuitry. The first LFSR based pseudorandom signal generator may generate a first pseudorandom signal and the second LFSR based pseudorandom signal generator may generate a second pseudorandom signal. The first bit reversal circuitry may receive the second pseudorandom signal and reverse a bit order of the second pseudorandom signal.

The first bitwise XOR circuitry may then receive the first pseudorandom signal and the second pseudorandom signal and apply a bitwise XOR to the first pseudorandom signal and the second pseudorandom signal. Moreover, the floating point conversion circuitry may receive a value based on a result of the bitwise XOR and pack the value into a mantissa of a floating point value. The subtraction circuitry may then subtract a value from the floating point value to generate a dither signal that includes a rectangular dither within a defined interval.

In another example, the dithering circuitry may also include a third LFSR based pseudorandom signal generator, a fourth LFSR based pseudorandom signal generator, second bit reversal circuitry, second bitwise XOR circuitry, and/or addition circuitry. The third LFSR based pseudorandom generator may generate a third pseudorandom signal and the fourth LFSR based pseudorandom generator may generate a fourth pseudorandom signal. The second bit reversal circuitry may receive the fourth pseudorandom signal and reverse a bit order of the fourth pseudorandom signal. The addition circuitry may add a result of the first bitwise XOR circuitry to a result of the second bitwise XOR. Moreover, the floating point conversion circuitry may pack a result of the addition circuitry into the mantissa of the floating point value. The subtraction circuitry may then subtract a value from the floating point value to generate the dither signal that includes a triangular dither within a defined interval. Accordingly, an electronic device may add the dither signal to a media signal, such as an audio signal or a video signal. Thus, for example, the electronic device may output a dithered audio signal via a speaker of the electronic device to rapidly produce audio that has fewer or no audible quantization errors.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
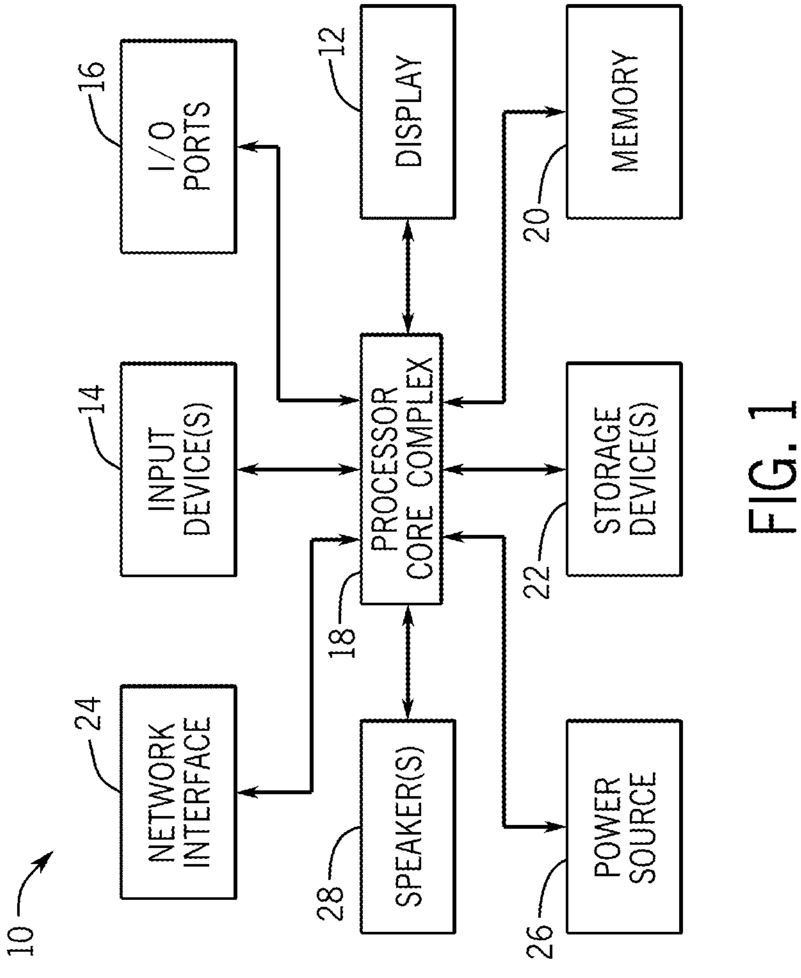
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The present disclosure generally relates to generating a rectangular dither and a triangular dither using linear feedback shift register (LFSR) based dithering circuitry of an electronic device. A first LFSR (e.g., a first LFSR based pseudorandom generator) and a second LFSR (e.g., a second LFSR based pseudorandom generator), which may be running in opposite directions, of the electronic device may insert (e.g., pack) values into a mantissa of floating point hardware (e.g., via first bitwise XOR circuitry) to generate a floating point value. In this manner, the electronic device may employ the dithering circuitry to efficiently convert a fixed point value to the floating point value. The electronic device may then subtract a fixed value from the floating point value via subtraction circuitry to generate a first dither signal. Thus, the first dither signal may include a rectangular dither within a first defined interval. That is, the first dither signal may include a rectangular probability density function.

Additionally, in some embodiments, a third LFSR and a fourth LFSR of the electronic device may insert values into the mantissa of the floating point hardware (e.g., via second XOR bitwise circuitry) to generate the floating point values. The electronic device may then subtract the fixed value from the floating point values to generate a second dither signal. Therefore, the second dither signal may include a triangular dither within a second defined interval. That is, the second dither signal may include a triangular probability density function. Accordingly, embodiments described herein may enable efficient generation of rectangular dither and triangular dither using the LFSR based dithering circuitry. Indeed, embodiments described herein may generate the rectangular dither and the triangular dither by employing existing hardware on the electronic device via a single instruction. In this manner, embodiments described herein reduce latency in dither generation, improve availability of computing resources, and enable efficient conversion of a fixed point value into the floating point value.

FIG. 1 is a block diagram of an electronic device 10 including an electronic display 12, according to embodiments of the present disclosure. As is described in more detail below, the electronic device 10 may be any suitable electronic device, such as a computer, a mobile phone, a portable media device, a tablet, a television, a virtual-reality headset, a wearable device such as a watch, a vehicle dashboard, earphones, a headset, or the like. Thus, it should be noted that FIG. 1 is merely one example of a particular implementation and is intended to illustrate the types of components that may be present in an electronic device 10.

The electronic device 10 includes the electronic display 12, one or more input devices 14, one or more input/output (I/O) ports 16, a processor core complex 18 having one or more processing circuitry(s) or processing circuitry cores, local memory 20, a main memory storage device 22, a network interface 24, a power source 26 (e.g., power supply), and one or more speakers 28. The various components described in FIG. 1 may include hardware elements (e.g., circuitry), software elements (e.g., a tangible, non-transitory computer-readable medium storing executable instructions), or a combination of both hardware and software elements. It should be noted that the various depicted components may be combined into fewer components or separated into additional components. For example, the local memory 20 and the main memory storage device 22 may be included in a single component. Further, it should be noted that the electronic device 10 may include dithering circuitry to perform embodiments described herein.

The processor core complex 18 is operably coupled with local memory 20 and the main memory storage device 22. Thus, the processor core complex 18 may execute instructions stored in local memory 20 and/or the main memory storage device 22 to perform operations, such as generating or transmitting image data to display on the electronic display 12. As such, the processor core complex 18 may include one or more processors, one or more general purpose microprocessors, one or more application specific integrated circuits (ASICs), one or more field programmable logic arrays (FPGAs), or any combination thereof. In some embodiments, a system on a chip (SoC) may include the processor core complex 18, among other things.

In addition to program instructions, the local memory 20 or the main memory storage device 22 may store data to be processed by the processor core complex 18. Thus, the local memory 20 and/or the main memory storage device 22 may include one or more tangible, non-transitory, computer-readable media. For example, the local memory 20 may include random access memory (RAM) and the main memory storage device 22 may include read-only memory (ROM), rewritable non-volatile memory such as flash memory, hard drives, optical discs, or the like.

The network interface 24 may communicate data with another electronic device or a network. For example, the network interface 24 (e.g., a radio frequency system) may enable the electronic device 10 to communicatively couple to a personal area network (PAN), such as a Bluetooth network, a local area network (LAN), such as an 802.11x Wi-Fi network, or a wide area network (WAN), such as a 4G, Long-Term Evolution (LTE), or 5G cellular network.

The power source 26 may provide electrical power to one or more components in the electronic device 10, such as the processor core complex 18 or the electronic display 12. For example, the power source 26 may include a power supply rail and/or a ground terminal coupled to the one or more components in the electronic device 10, such as the processor core complex 18 or the electronic display 12, to provide the electrical power. Thus, the power source 26 may include any suitable source of energy, such as a rechargeable lithium polymer (Li-poly) battery or an alternating current (AC) power converter.

The I/O ports 16 may enable the electronic device 10 to interface with other electronic devices. For example, when a portable storage device is connected, the I/O port 16 may enable the processor core complex 18 to communicate data with the portable storage device. The input devices 14 may enable user interaction with the electronic device 10, for example, by receiving user inputs via a button, a keyboard, a mouse, a trackpad, or the like. The input device 14 may include touch-sensing components in the electronic display 12. The touch sensing components may receive user inputs by detecting occurrence or position of an object touching the surface of the electronic display 12. The speakers 28 may enable the electronic device 10 to convert electrical signals into audible sound. That is, the electronic device 10 may generate one or more audio signals, add a dither signal to the audio signals, and output the dithered audio signal via the speakers 28. Thus, the speakers 28 may include components for amplifying and projecting sound to provide the dithered audio output for various applications.

Figures 2, 3:
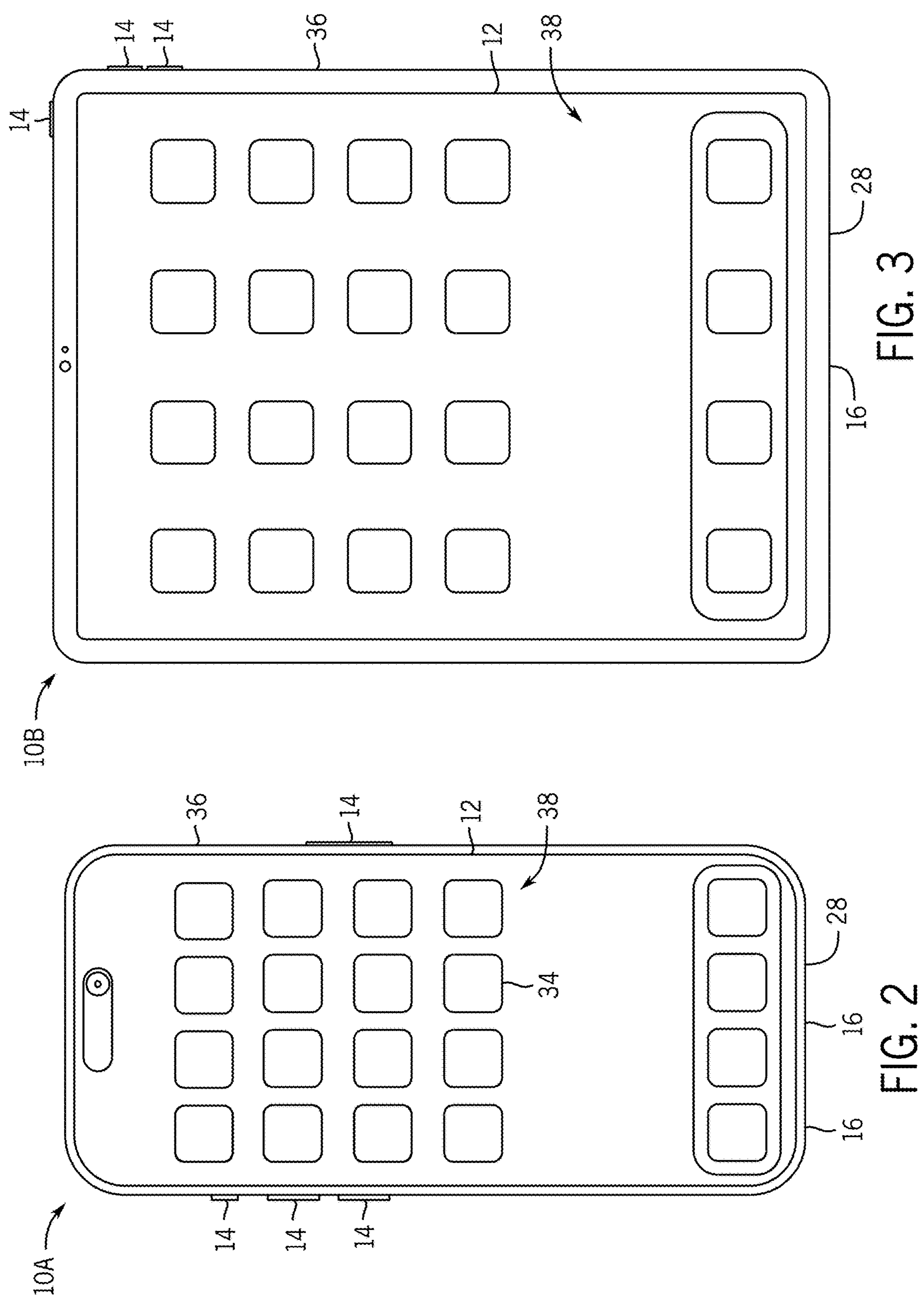
FIG. 2 is a front view of a handheld device representing an example of the electronic device of FIG. 1, according to embodiments of the present disclosure.
FIG. 3 is a front view of another handheld device representing another example of the electronic device of FIG. 1, according to embodiments of the present disclosure.

To help illustrate, an example of the electronic device 10, a handheld device 10A, is shown in FIG. 2. The handheld device 10A may be a portable phone, a media player, a personal data organizer, a handheld game platform, or the like. For illustrative purposes, the handheld device 10A may be a smart phone, such as any IPHONE® model available from Apple Inc. The handheld device 10A includes an enclosure 36 (e.g., housing). The enclosure 36 may protect interior components from physical damage or shield them from electromagnetic interference, such as by surrounding the electronic display 12. The electronic display 12 may display a graphical user interface (GUI) 38 having an array of icons. As such, when an icon 34 is selected either by an input device 14 or a touch-sensing component of the electronic display 12, an application program may launch.

The input devices 14 may be accessed through openings in the enclosure 36. The input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, or toggle between vibrate and ring modes.

Figure 4:
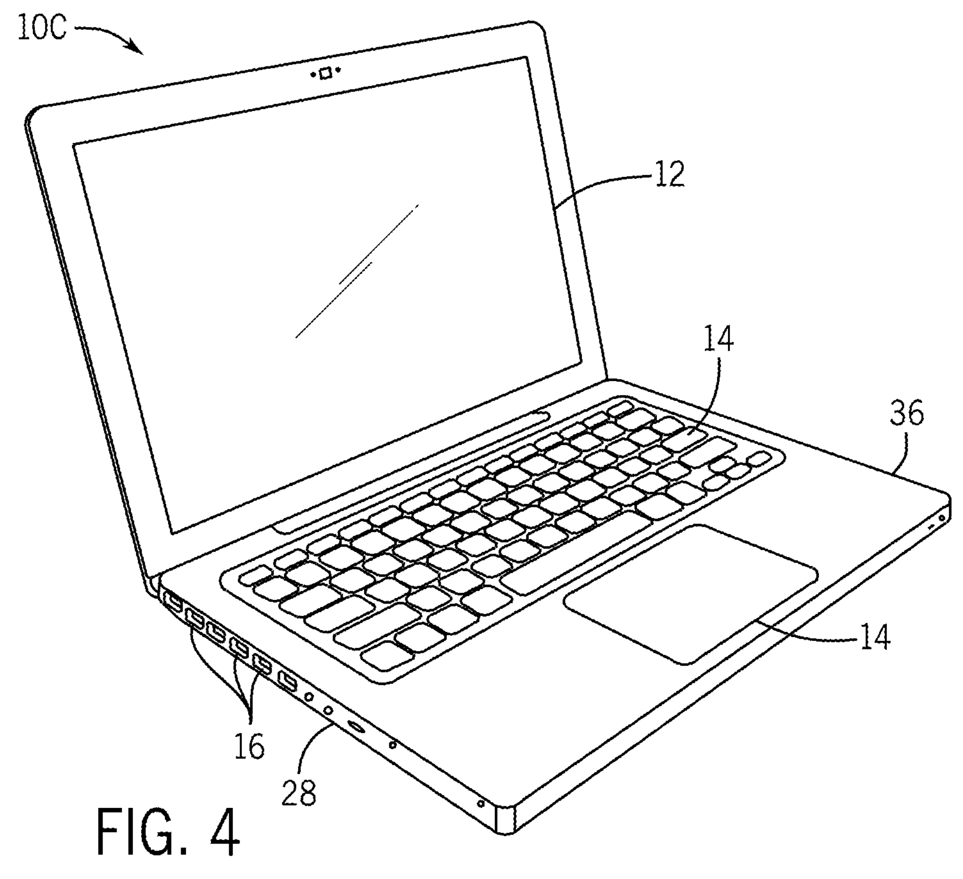
FIG. 4 is a perspective view of a notebook computer representing an example of the electronic device of FIG. 1, according to embodiments of the present disclosure.
Figure 5:
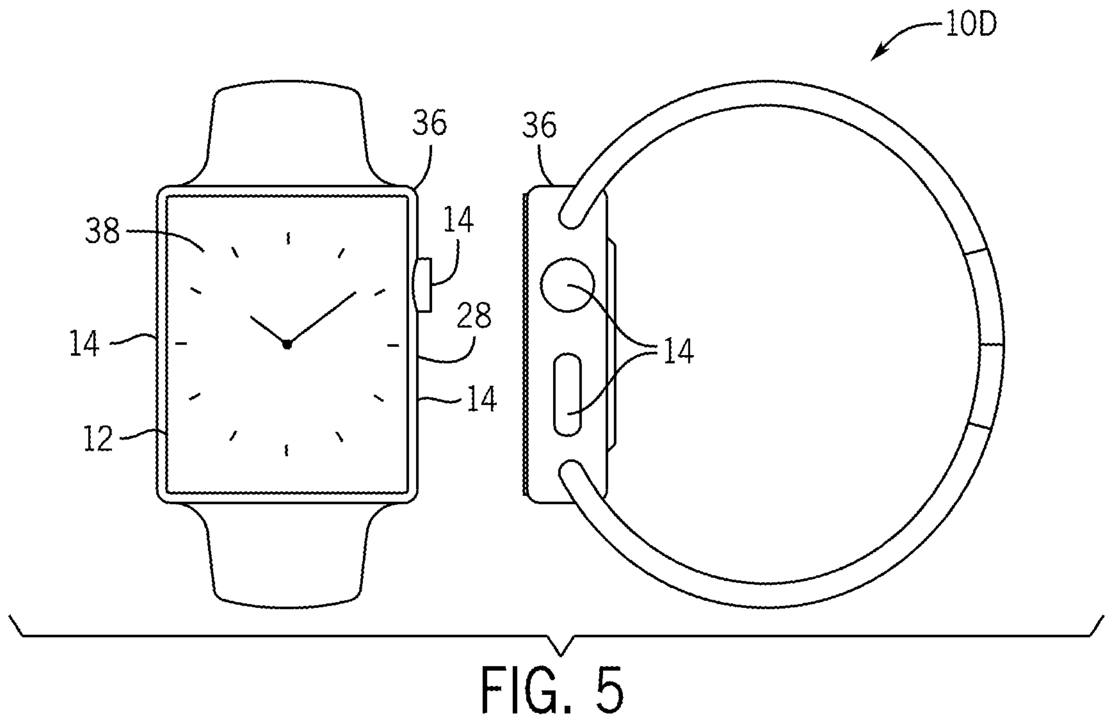
FIG. 5 illustrates front and side views of a wearable electronic device representing another example of the electronic device of FIG. 1, according to embodiments of the present disclosure.

Another example of a suitable electronic device 10, specifically a tablet device 10B, is shown in FIG. 3. The tablet device 10B may be any IPAD® model available from Apple Inc. A further example of a suitable electronic device 10, specifically a computer 10C, is shown in FIG. 4. For illustrative purposes, the computer 10C may be any MACBOOK® or IMAC® model available from Apple Inc. Another example of a suitable electronic device 10, specifically a watch 10D, is shown in FIG. 5. For illustrative purposes, the watch 10D may be any APPLE WATCH® model available from Apple Inc.

Figure 6:
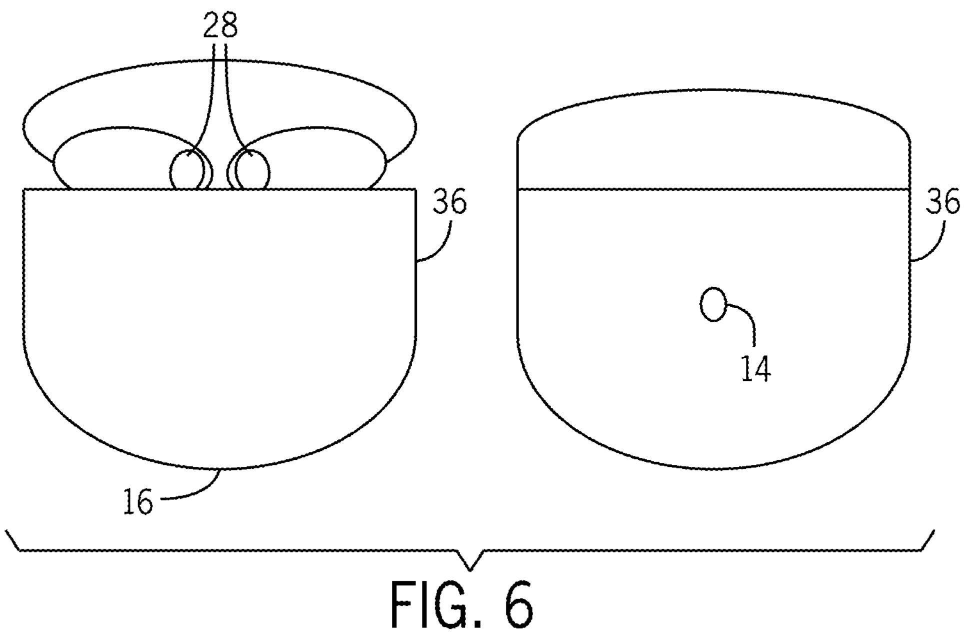
FIG. 6 is a perspective view of an audio device representing an example of the electronic device of FIG. 1, according to embodiments of the present disclosure.
Figure 7:
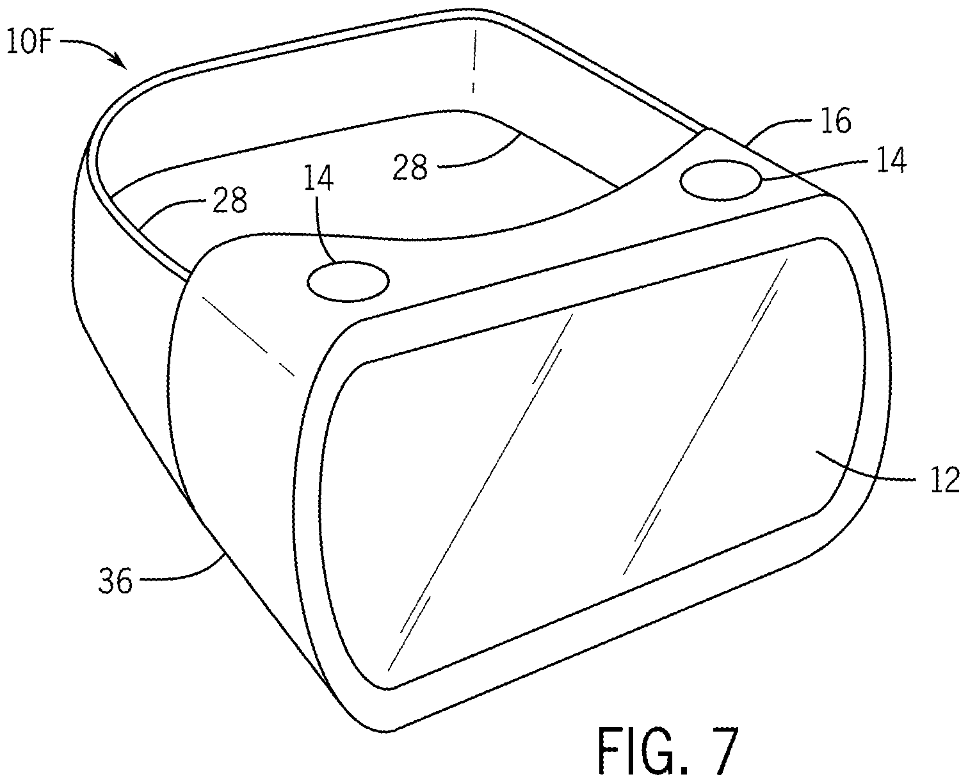
FIG. 7 is a perspective view of a headset representing an example of the electronic device of FIG. 1, according to embodiments of the present disclosure.

Another example of a suitable electronic device 10, specifically an audio device 10E, is shown in FIG. 6. For illustrative purposes, the audio device 10E may be any AIRPODS® model available from Apple Inc. Another example of a suitable electronic device 10, specifically a headset 10F (e.g., an extended reality (XR), mixed reality (MR), virtual reality (VR), and/or augmented reality (AR) headset), is shown in FIG. 7. For illustrative purposes, the headset 10F may be any VISION PRO® model available from Apple Inc.

As depicted, the tablet device 10B, the computer 10C, the watch 10D, and the headset 10F each also includes an electronic display 12, input devices 14, I/O ports 16, the speakers 28, and an enclosure 36. The electronic display 12 may display a graphical user interface (GUI) 38. As shown in FIG. 5, the GUI 38 may show a visualization of a clock. When the visualization is selected either by the input device 14 or a touch-sensing component of the electronic display 12, an application program may launch, such as to transition the GUI 38 to presenting the icons 34 discussed with respect to FIGS. 2 and 3. Further as depicted, the audio device 10E may include the input devices 14, the I/O ports 16, the speakers 28, and the enclosure 36.

Figure 8:
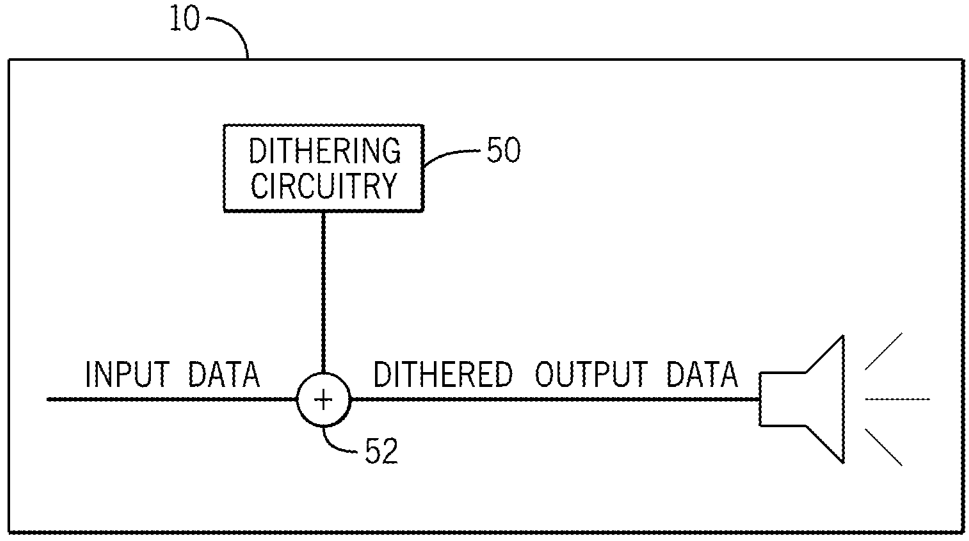
FIG. 8 is a block diagram illustrating generation of dithered output data by the electronic device of FIG. 1, according to embodiments of the present disclosure.

FIG. 8 is a block diagram illustrating generation of dithered output media data by the electronic device 10 of FIG. 1. As illustrated, the electronic device 10 may receive input data, such as audio data (e.g., an audio signal). While audio data is described herein, the electronic device may generate the dither for any suitable type of signal. For example, the types of signal of the input data may include audio processing signals, image processing signals, video processing signals, communication system signals, and/or any other suitable type of signal. For example, the input data may include audio data obtained from one or more audio sources, such as a microphone, a digital audio file, a streaming service, and/or any other suitable audio source.

The electronic device 10 may include dithering circuitry 50 to enable generation of a dither (e.g., rectangular dither and/or triangular dither). For example, the dither may include a signal (e.g., noise signal) that is added to the input data, which may enable randomization of quantization errors that occur during a digital-to-analog conversion process or any other suitable processing steps. The electronic device 10 may add the dither to the input data at an adder 52. Thus, by adding dither to the input data, the electronic device 10 may generate (e.g., create, provide) dithered output data. Indeed, the dithered output data may include the original input data (e.g., original audio signal) with the dither noise added. Accordingly, the dither may reduce distortion caused by quantization while also reducing audible artifacts caused by the noise or the distortion. Additionally or alternatively, the dither may improve audio quality by masking the quantization noise.

Figure 9:
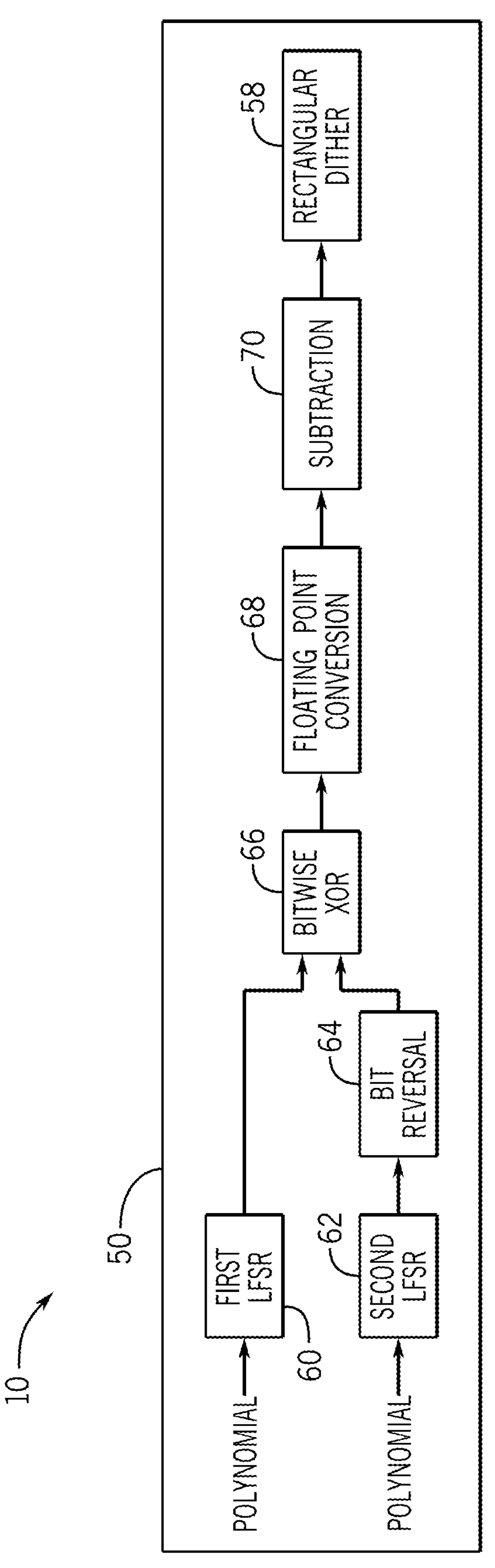
FIG. 9 is a block diagram of dithering circuitry that generates a rectangular dither, according to embodiments of the present disclosure.

With the foregoing in mind, FIG. 9 is a block diagram of the dithering circuitry 50 that generates a rectangular dither 58. The dithering circuitry may include a first LFSR 60 (e.g., an LFSR based pseudorandom signal generator), a second LFSR 62 (e.g., a second LFSR based pseudorandom signal generator), first bit reversal circuitry 64, first bitwise exclusive OR (XOR) circuitry 66, floating point conversion circuitry 68, and/or subtraction circuitry 70. The first LFSR 60 may generate a first pseudorandom signal (e.g., pseudorandom sequence) based on a first feedback mechanism (e.g., linear feedback mechanism). Moreover, the second LFSR 62 may generate a second pseudorandom signal based on a second feedback mechanism.

For example, the first feedback mechanism may be based on a current state of the first LFSR 60 and a first polynomial (e.g., first feedback polynomial), while the second feedback mechanism may be based on a current state of the second LFSR 62 and a second polynomial (e.g., second feedback polynomial). In some embodiments, the first polynomial and/or the second polynomial may be configurable. Additionally or alternatively, the first polynomial and/or the second polynomial may include an even number of ones. It should be noted that the first polynomial may be different from the second polynomial.

In other embodiments, initial values for the first LFSR 60 and the second LFSR 62 may be configurable. Furthermore, the first LFSR 60 and/or the second LFSR 62 may each be thirty-two bit LFSRs. The first LFSR 60 and/or the second LFSR 62 may each extract twenty-three of the least significant bits (LSB) from the thirty-two bits. In this manner, the first pseudorandom signal and the second pseudorandom signal may each include twenty-three pseudorandom bits.

The first bit reversal circuitry 64 may receive the second pseudorandom signal from the second LFSR 62 and reverse a bit order (e.g., change a sequence of bits) of the second pseudorandom signal. The first bitwise XOR circuitry 66 may receive the first pseudorandom signal from the first LFSR 60 and the second pseudorandom signal from the first bit reversal circuitry 64. The first bitwise XOR circuitry 66 may then apply a bitwise XOR to the first pseudorandom signal and the second pseudorandom signal to generate a result (e.g., first sample), such as a fixed value. For example, the result may include twenty-three bits based on a mantissa of the floating point conversion circuitry 68 having a capacity (e.g., storage) of twenty-three bits. As another example, the result may include a value on a range of twenty-three bits to fifty-two bits based on the floating point conversion circuitry 68.

As such, the floating point conversion circuitry 68 may receive the result from the first bitwise XOR circuitry 66 and pack the result into the mantissa of a floating point value to generate (e.g., produce) the floating point value within a defined interval. For example, the lower twenty-three bits of the mantissa may be replaced by the result from the first bitwise XOR circuitry 66 to produce the floating point value within the defined interval. As an example, the defined interval may include a range from two to four (e.g., [2, 4]), where the minimum value is two and the maximum value is less than four (e.g., 2-3.999).

The subtraction circuitry 70 may receive the floating point value from the floating point conversion circuitry 68 and subtract a value from the floating point value to generate the rectangular dither 58 within the defined interval. For example, the value may include three and the defined interval may include a range from negative one to one (e.g., [−1, 1]), where the minimum value is negative one and the maximum value is less than one (e.g., −1 to 0.999). As such, the subtraction circuitry 70 may enable the floating point value to be within the defined interval by subtracting the value from the floating point value. Therefore, the dithering circuitry 50 may enable efficient conversion of fixed point values to floating point values.

In some embodiments, the floating point conversion circuitry 68 may provide the value and a negative value to addition circuitry. Indeed, for example, the floating point conversion circuitry 68 may provide the value and a negative three to the addition circuitry to generate the rectangular dither 58. The electronic device 10 may then use the rectangular dither 58 generated by the dithering circuitry 50 to dither one or more audio signals. The dithering circuitry 50 may generate the rectangular dither based on a single instruction (e.g., provided by the processor core complex 18), rather than executing multiple instructions. In this manner, the dithering circuitry 50 may reduce latency in generating the rectangular dither. In addition, the dithering circuitry 50 may generate the rectangular dither by employing existing hardware of the electronic device 10, which may improve computing resource usage.

In some embodiments, the dithering circuitry 50 described herein may generate a triangular dither. Indeed, the first LFSR 60 may generate a third pseudorandom signal and the second LFSR 62 may generate a fourth pseudorandom signal. Further, the first bit reversal circuitry 64 may reverse the bit order of the fourth pseudorandom signal. The first bitwise XOR circuitry 66 may then generate an additional result (e.g., second sample), which may be independent from the result generated based on the first pseudorandom signal and the second pseudorandom signal.

Addition circuitry may receive the result and the additional result and add the result to the additional result. In this manner, the floating point conversion circuitry may receive a result of the addition circuitry and pack the result of the addition circuitry into the mantissa of the floating point conversion circuitry 68 to generate the floating point value within the defined interval. Subtraction circuitry may then receive the floating point value from the floating point conversion circuitry 68 and subtract a value from the floating point value to generate the triangular dither within a defined interval.

Figure 10:
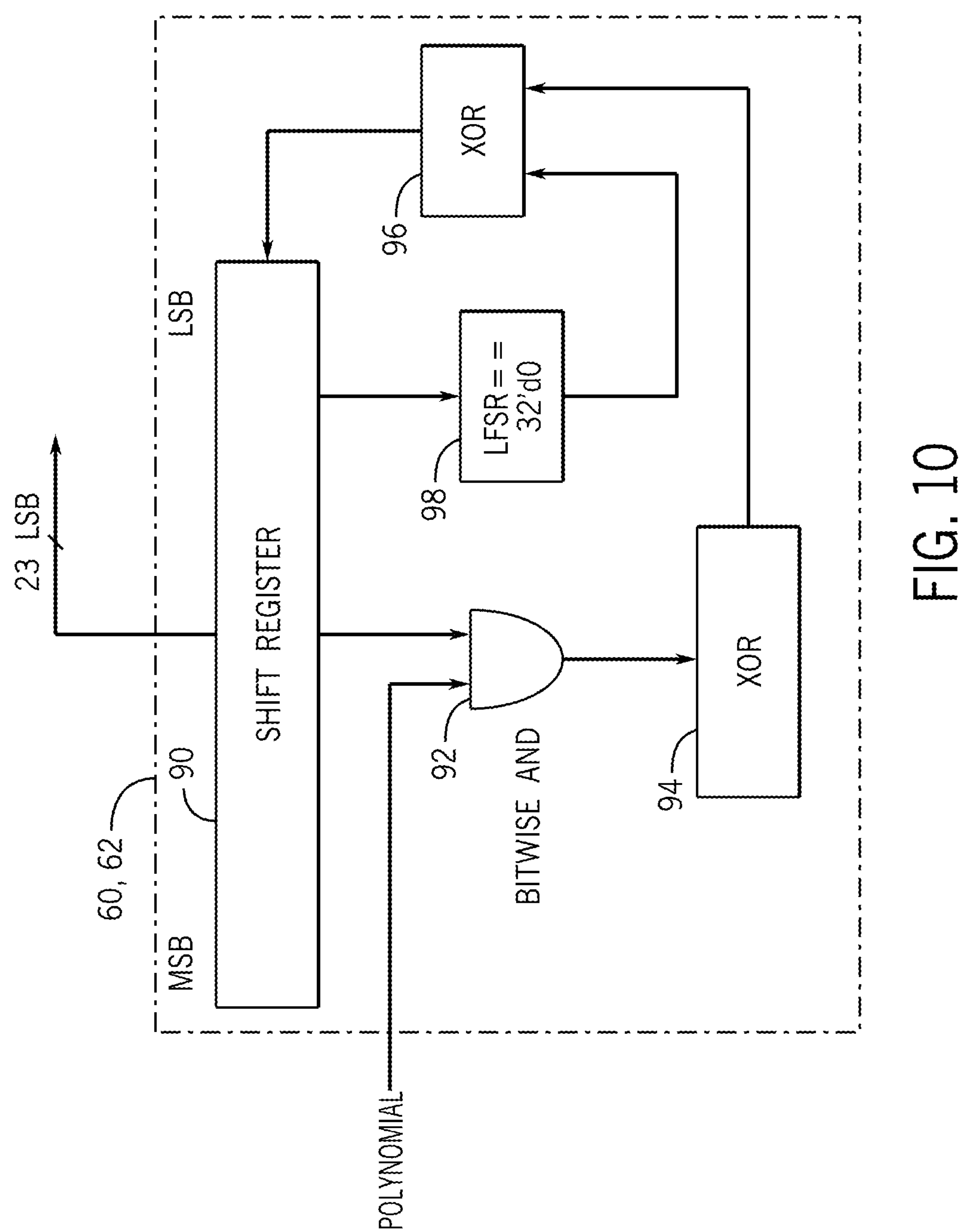
FIG. 10 is an example illustration of a first LFSR or a second LFSR employed by the dithering circuitry, according to embodiments of the present disclosure.

FIG. 10 is an example illustration of the first LFSR 60 or the second LFSR 62 employed by the dithering circuitry 50. That is, FIG. 10 is an example illustration of one or more components (e.g., circuitry) that may be respectively included in the first LFSR 60 and the second LFSR 62. As illustrated, each of the first LFSR 60 and the second LFSR 62 may include a shift register 90, bitwise AND circuitry 92, first XOR circuitry 94, second XOR circuitry 96, and/or lock up prevention circuitry 98. The shift register 90 may include a series of flips flops and/or any suitable memory element that may store one or more bits. Further, as described herein, the first LFSR 60 may be defined by the first polynomial and the second LFSR 62 may be defined by the second polynomial. In operation, the bitwise AND circuitry 92 may receive the one or more bits from the shift register 90 and combine the one or more bits based on the first polynomial or the second polynomial to produce a result.

The first XOR circuitry 94 may receive the result and generate a feedback value (e.g., output) based on the combined bits from the shift register 90. The second XOR circuitry 96 may receive the feedback value from the first XOR circuitry 94 and determine an output bit of an LFSR sequence (e.g., the first pseudorandom signal or the second pseudorandom signal). The output bit may then be provided back into the shift register 90 and the contents of the shift register 90 may be shifted (e.g., one position). Thus, at each clock cycle (e.g., iteration), the one or more bits in the shift register 90 may shift one position (e.g., to the left toward a Most Significant Bit (MSB)).

It should be noted that the process described herein with respect to FIG. 10 may repeat for any number of clock cycles (e.g., iterations) of the first LFSR 60 to generate the first pseudorandom signal (e.g., the twenty-third LSB associated with the first pseudorandom signal) or the second LFSR 62 to generate the second pseudorandom signal (e.g., the twenty-three LSB associated with the second pseudorandom signal). In some embodiments, the first LFSR 60 or the second LFSR 62 may include the lockup prevention circuitry 98. An output of the lockup prevention circuitry 98 may be provided to the second XOR circuitry 96 to prevent the first LFSR 60 or the second LFSR 62 from entering a non-changing state (e.g., a state with a repetitive sequence of zeros). Furthermore, it should be noted that the components described above with respect to the first LFSR 60 and the second LFSR 62 are merely illustrative, and any other suitable components may be included in the first LFSR 60 and the second LFSR 62.

Figure 11:
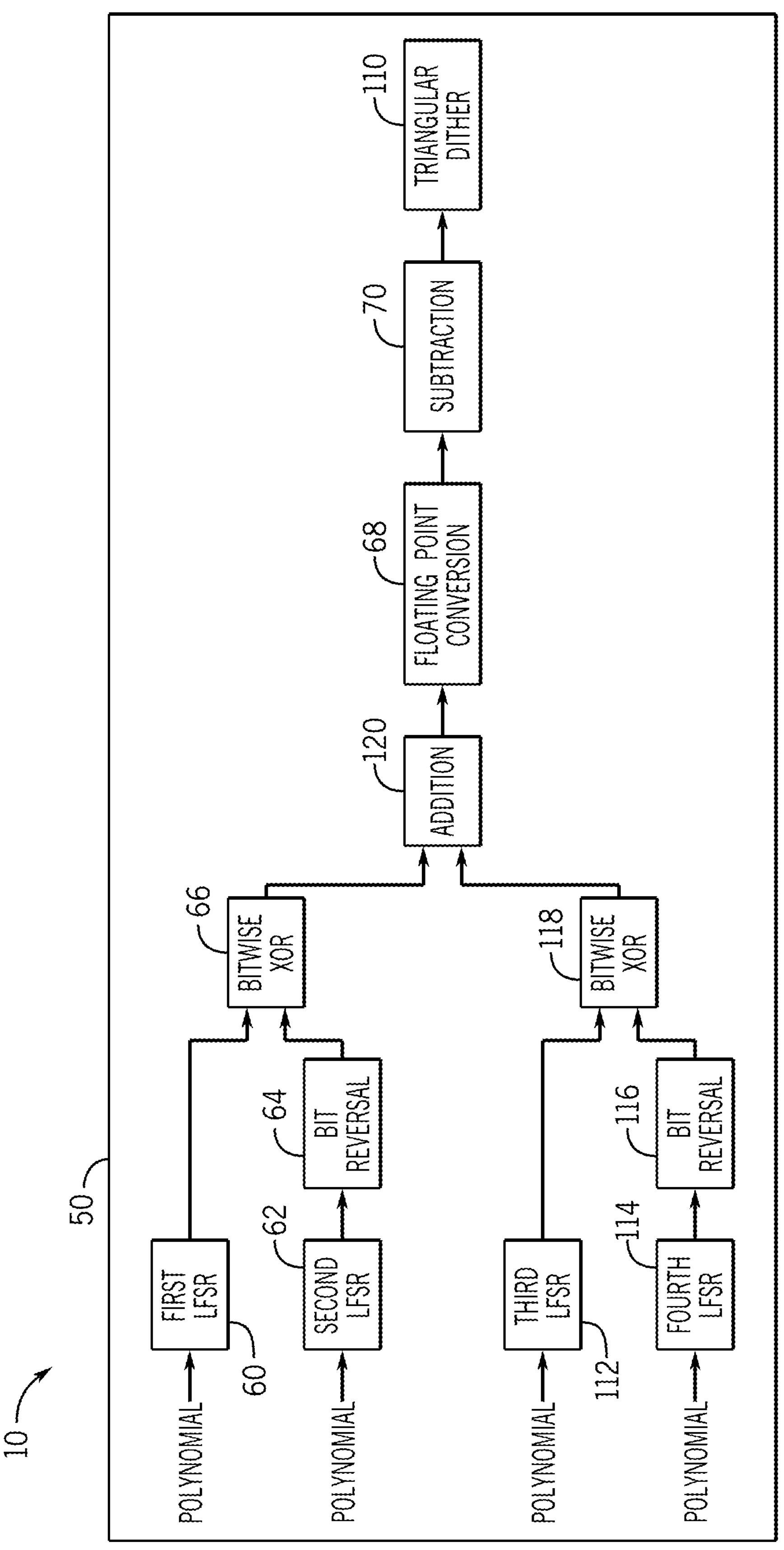
FIG. 11 is a block diagram of dithering circuitry that generates a triangular dither, according to embodiments of the present disclosure.

As described herein, the dithering circuitry 50 may also be used to generate a triangular dither 110. As such, FIG. 11 is a block diagram of dithering circuitry 50 that generates the triangular dither 110, according to embodiments of the present disclosure. As illustrated in FIG. 11, the dithering circuitry 50 may include the first LFSR 60, the second LFSR 62, a third LFSR 112 (e.g., a third LFSR based pseudorandom signal generator), a fourth LFSR 114 (e.g., a fourth LFSR based pseudorandom signal generator), the first bit reversal circuitry 64, second bit reversal circuitry 116, the first bitwise XOR circuitry 66, second bitwise XOR circuitry 118, addition circuitry 120, the floating point conversion circuitry 68, and/or the subtraction circuitry 70. The third LFSR 112 and/or the fourth LFSR 114 may operate the same as or similar to the first LFSR 60 and/or the second LFSR 62. Additionally or alternatively, the second bit reversal circuitry 116 may operate the same as or similar to the first bit reversal circuitry 64. Furthermore, the second bitwise XOR circuitry 118 may operate the same as or similar to the first bitwise XOR circuitry 66.

As described herein, the first LFSR 60 may generate the first pseudorandom signal based on the first polynomial and the second LFSR 62 may generate the second pseudorandom signal based on the second polynomial. The first bit reversal circuitry 64 may receive the second pseudorandom signal and reverse the bit order of the second pseudorandom signal. In addition, the first bitwise XOR circuitry 66 may receive the first pseudorandom signal from the first LFSR 60 and the second pseudorandom signal from the first bit reversal circuitry 64. The first bitwise XOR circuitry 66 may then apply the bitwise XOR to the first pseudorandom signal and the second pseudorandom signal to generate a result of the first bitwise XOR circuitry 66.

Furthermore, the third LFSR 112 may generate a third pseudorandom signal and the fourth LFSR 114 may generate a fourth pseudorandom signal. The second bit reversal circuitry 116 may receive the fourth pseudorandom signal from the fourth LFSR 114 and reverse a bit order the fourth pseudorandom signal. The second bitwise XOR circuitry 118 may receive the third pseudorandom signal from the third LFSR 112 and the fourth pseudorandom signal from the second bit reversal circuitry 116. The second bitwise XOR circuitry 118 may then apply the bitwise XOR to the third pseudorandom signal and the fourth pseudorandom signal to generate a result of the second bitwise XOR circuitry 118.

The addition circuitry 120 may receive the result of the first bitwise XOR circuitry 66 and the result of the second bitwise XOR circuitry 118. The addition circuitry 120 may then add the result of the first bitwise XOR circuitry 66 to the result of the second bitwise XOR circuitry 118 to provide a result of the addition circuitry 120. Moreover, the floating point conversion circuitry 68 may receive the result of the addition circuitry 120 and pack the result of the addition circuitry into the mantissa of the floating point value to generate the floating point value within the defined interval.

Additionally, the subtraction circuitry 70 may receive the floating point value from the floating point conversion circuitry 68 and subtract a value from the floating point value to generate the triangular dither 110 within a defined interval. For example, the value may include three and the defined interval may include a range from negative one to one (e.g., [−1, 1]). The electronic device 10 may then use the triangular dither 110 generated by the dithering circuitry 50 to dither the one or more audio signals. As such, the subtraction circuitry 70 may enable the floating point value to be within the defined interval by subtracting the value from the floating point value. Therefore, the dithering circuitry 50 may enable efficient conversion of fixed point values to floating point values.

Furthermore, it should be noted that the dithering circuitry 50 may generate the triangular dither based on a single instruction (e.g., provided by the processor core complex 18), rather than executing multiple instructions. In this manner, the dithering circuitry 50 may reduce latency in generating the triangular dither. In addition, the dithering circuitry 50 may generate the triangular dither by employing existing hardware of the electronic device 10, which may improve computing resource usage.

Figure 12:
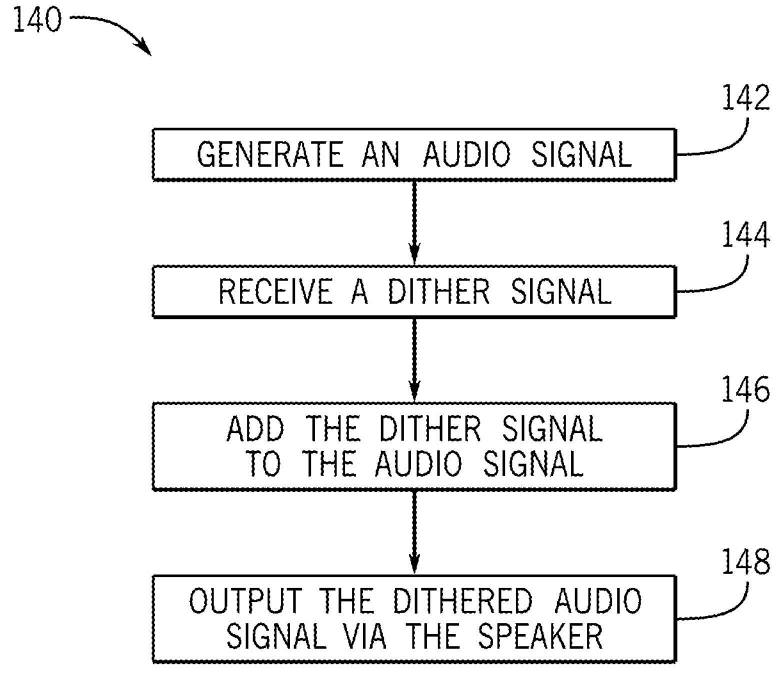
FIG. 12 is a flowchart of a method for outputting a dithered audio signal via a speaker, according to embodiments of the present disclosure.

Indeed, FIG. 12 is a flowchart of a method 140 for outputting a dithered audio signal via the speakers 28. Any suitable device that may control components of the electronic device 10, such as the processor core complex 18, may perform the output of the dithered audio data. In some embodiments, the method 140 may be implemented by executing instructions stored in a tangible, non-transitory, computer-readable medium, such as the memory 20, using the processor core complex 18. For example, the processor core complex 18 may execute instructions to cause the dithering circuitry 50 to perform at least some of the steps described herein. Indeed, as an example, the method 140 may be performed by the components of the dithering circuitry 50 of the electronic device 10. As another example, the method 140 may be performed at least in part by one or more software components, such as an operating system of the electronic device 10, one or more software applications of the electronic device 10, and the like. While the method 140 is described using steps in a specific sequence, it should be understood that the present disclosure contemplates that the described steps may be performed in different sequences than the sequence illustrated, and certain described steps may be skipped or not performed altogether.

At block 142, the processor core complex 18 may generate an audio signal. For example, the processor core complex 18 may convert an electrical signal into sound waves to generate the audio signal. At block 144, the processor core complex 18 may receive a dither signal. For example, the processor core complex 18 may instruct the dithering circuitry 50 to generate the dither signal and receive the dither signal from the dithering circuitry 50. As another example, the dither signal may include the rectangular dither 58 described above with respect to FIG. 6 or the triangular dither 110 described above with respect to FIG. 8.

At block 146, the processor core complex 18 may add the dither signal to the audio signal. For example, the dither signal may include a low-level noise signal that is added to the audio signal before quantization. In this manner, the dither signal may randomize quantization error, which may mask harmonic distortion cause by the quantization. At block 148, the processor core complex 18 may output the dithered audio signal via the speakers 28.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. An electronic device comprising:

a speaker configured to output an audio signal based on dithered audio data; and dithering circuitry configured to generate a dither signal to add to the audio signal to generate the dithered audio signal, wherein the dithering circuitry comprises:

a first pseudorandom signal generator comprising a first linear feedback shift register configured to generate a first pseudorandom signal;

a second pseudorandom signal generator comprising a second linear feedback shift register configured to generate a second pseudorandom signal;

first bit reversal circuitry configured to reverse a bit order of the second pseudorandom signal;

first bitwise XOR circuitry configured to apply a bitwise exclusive OR to the first pseudorandom signal and the second pseudorandom signal;

floating point conversion circuitry configured to pack a result of the bitwise exclusive OR into a mantissa of a floating point value; and subtraction circuitry configured to subtract a value from the floating point value to generate the dither signal.

2. The electronic device of claim 1, wherein the dither signal comprises a rectangular dither within a defined interval.

3. The electronic device of claim 1, wherein the dithering circuitry comprises:

the first linear feedback shift register configured to generate a third pseudorandom signal; and the second linear feedback shift register configured to generate a fourth pseudorandom signal.

4. The electronic device of claim 3, wherein the dithering circuitry comprises:

the first bit reversal circuitry configured to reverse a bit order of the fourth pseudorandom signal; and the first bitwise XOR circuitry configured to apply a bitwise exclusive OR to the third pseudorandom signal and the fourth pseudorandom signal.

5. The electronic device of claim 4, wherein the dithering circuitry comprises:

addition circuitry to add a result of the bitwise exclusive OR of the first pseudorandom signal and the second pseudorandom signal to the bitwise exclusive OR of the third pseudorandom signal and the fourth pseudorandom signal; and the floating point conversion circuitry configured to pack a result of the addition circuitry into the mantissa of the floating point value.

6. The electronic device of claim 1, wherein the dithering circuitry comprises:

a third pseudorandom signal generator comprising a third linear feedback shift register configured to generate a third pseudorandom signal;

a fourth pseudorandom signal generator comprising a fourth linear feedback shift register configured to generate a fourth pseudorandom signal;

second bit reversal circuitry configured to reverse a bit order of the fourth pseudorandom signal; and second bitwise XOR circuitry configured to apply a bitwise exclusive OR to the third pseudorandom signal and the fourth pseudorandom signal.

7. The electronic device of claim 6, wherein the dithering circuitry comprises addition circuitry configured to add a result of the bitwise exclusive OR of the first pseudorandom signal and the second pseudorandom signal to the bitwise exclusive OR of the third pseudorandom signal and the fourth pseudorandom signal.

8. The electronic device of claim 7, wherein the dithering circuitry comprises the floating point conversion circuitry configured to pack a result of the addition circuitry into the mantissa of the floating point value.

9. The electronic device of claim 8, wherein the dithering circuitry comprises the subtraction circuitry configured to subtract the value from the floating point value to generate the dither signal.

10. The electronic device of claim 9, wherein the dither signal comprises a triangular dither within a defined interval.

11. Dithering circuitry comprising:

a first linear feedback shift register based pseudorandom signal generator configured to generate a first pseudorandom signal;

a second linear feedback shift register based pseudorandom signal generator configured to generate a second pseudorandom signal;

first bit reversal circuitry configured to reverse a bit order of the second pseudorandom signal;

first bitwise XOR circuitry configured to apply a bitwise exclusive OR to the first pseudorandom signal and the second pseudorandom signal;

floating point conversion circuitry configured to pack a first value based on a result of the bitwise exclusive OR into a mantissa of a floating point value; and subtraction circuitry configured to subtract a second value from the floating point value to generate a dither signal.

12. The dithering circuitry of claim 11, wherein the dither signal comprises a rectangular dither within a defined interval.

13. The dithering circuitry of claim 11, comprising:

a third linear feedback shift register based pseudorandom signal generator configured to generate a third pseudorandom signal;

a fourth linear feedback shift register based pseudorandom signal generator configured to generate a fourth pseudorandom signal;

second bit reversal circuitry configured to reverse a bit order of the fourth pseudorandom signal;

second bitwise XOR circuitry configured to apply a bitwise exclusive OR to the third pseudorandom signal and the fourth pseudorandom signal;

addition circuitry configured to add the result of the bitwise exclusive OR of the first pseudorandom signal and the second pseudorandom signal to the bitwise exclusive OR of the third pseudorandom signal and the fourth pseudorandom signal;

wherein the floating point conversion circuitry is configured to pack the result of the addition circuitry into the mantissa of the floating point value.

14. The dithering circuitry of claim 13, wherein the dither signal comprises a triangular dither within a defined interval.

15. The dithering circuitry of claim 11, wherein the first linear feedback shift register based pseudorandom signal generator and the second linear feedback shift register based pseudorandom signal generator respectively comprise:

a shift register;

bitwise AND circuitry;

first XOR circuitry; and second XOR circuitry.

16. The dithering circuitry of claim 11, wherein the first linear feedback shift register based pseudorandom signal generator is associated with a first polynomial.

17. The dithering circuitry of claim 11, wherein the second linear feedback shift register based pseudorandom signal generator is associated with a second polynomial.

18. One or more tangible, non-transitory computer-readable media storing instructions that, when executed by processing circuitry, are configured to cause the processing circuitry to:

generate a first pseudorandom signal using a first linear feedback shift register;

generate a second pseudorandom signal using a second linear feedback shift register;

reverse a bit order of the second pseudorandom signal using first bit reversal circuitry;

apply a first bitwise exclusive OR to the first pseudorandom signal and the second pseudorandom signal using first bitwise XOR circuitry;

pack a first value into a mantissa of a floating point value based on a result of the first bitwise XOR circuitry; and subtract a second value from the floating point value to generate a dither signal.

19. The one or more tangible, non-transitory computer-readable media of claim 18, wherein the instructions, when executed by the processing circuitry, are configured to cause the processing circuitry to:

generate a third pseudorandom signal using a third linear feedback shift register;

generate a fourth pseudorandom signal using a fourth linear feedback shift register;

reverse a bit order of the fourth pseudorandom signal using second bit reversal circuitry;

apply a second bitwise exclusive OR to the third pseudorandom signal and the fourth pseudorandom signal using second bitwise XOR circuitry;

add the result of the bitwise exclusive OR of the first pseudorandom signal and the second pseudorandom signal to a bitwise exclusive XOR of the third pseudorandom signal and the fourth pseudorandom signal using addition circuitry; and pack a result of the addition circuitry into the mantissa of the floating point value.

20. The one or more tangible, non-transitory computer-readable media of claim 18, wherein the dither signal comprises a rectangular dither or a triangular dither.

* * * * *